United States Patent [19]

Tran

[11] Patent Number: 4,866,674

[45] Date of Patent: Sep. 12, 1989

[54] BITLINE PULL-UP CIRCUIT FOR A BICMOS READ/WRITE MEMORY

[75] Inventor: Hiep V. Tran, Carrollton, Tex.

[73] Assignee: Texas Instruments Incorporated, Dallas, Tex.

[21] Appl. No.: 158,017

[22] Filed: Feb. 16, 1988

[51] Int. Cl.⁴ ............................................. G11C 7/00
[52] U.S. Cl. ............................... 365/189.11; 365/190; 365/203; 365/207; 365/189.09
[58] Field of Search ............... 365/190, 230, 206, 189, 365/203, 207, 189.09, 189.11, 189.01, 230.01

[56] References Cited

U.S. PATENT DOCUMENTS 4,556,851  12/1985  Levine ................................. 365/206
4,661,928   4/1987  Yasuoka .............................. 365/206
4,730,279   3/1988  Ohtani ................................ 365/190

Primary Examiner—Terrell W. Fears
Assistant Examiner—Melissa J. Koval
Attorney, Agent, or Firm—Rodney M. Anderson; Melvin Sharp

[57] ABSTRACT

A BiCMOS static random access memory (SRAM) device is disclosed. The SRAM has an individual sense amplifier for each column therein, with bipolar pull-up transistors at the end of the bit lines opposite the sense amplifier. A pull-up control circuit which responds to the input data bus is provided for controlling the bias of the bases of the pull-up transistors so that, during a read cycle, the base of the pull-up device associated with the low side bit line is biased to a voltage which is lower than that to which the base of the pull-up device will be biased for a read; as a result, the time at which the bit line voltages cross-over for a read of an opposite data state is reduced. The pull-up control circuit further provides a low pass filter, for reducing the effects of power supply noise on the bit line differential voltage.

24 Claims, 5 Drawing Sheets

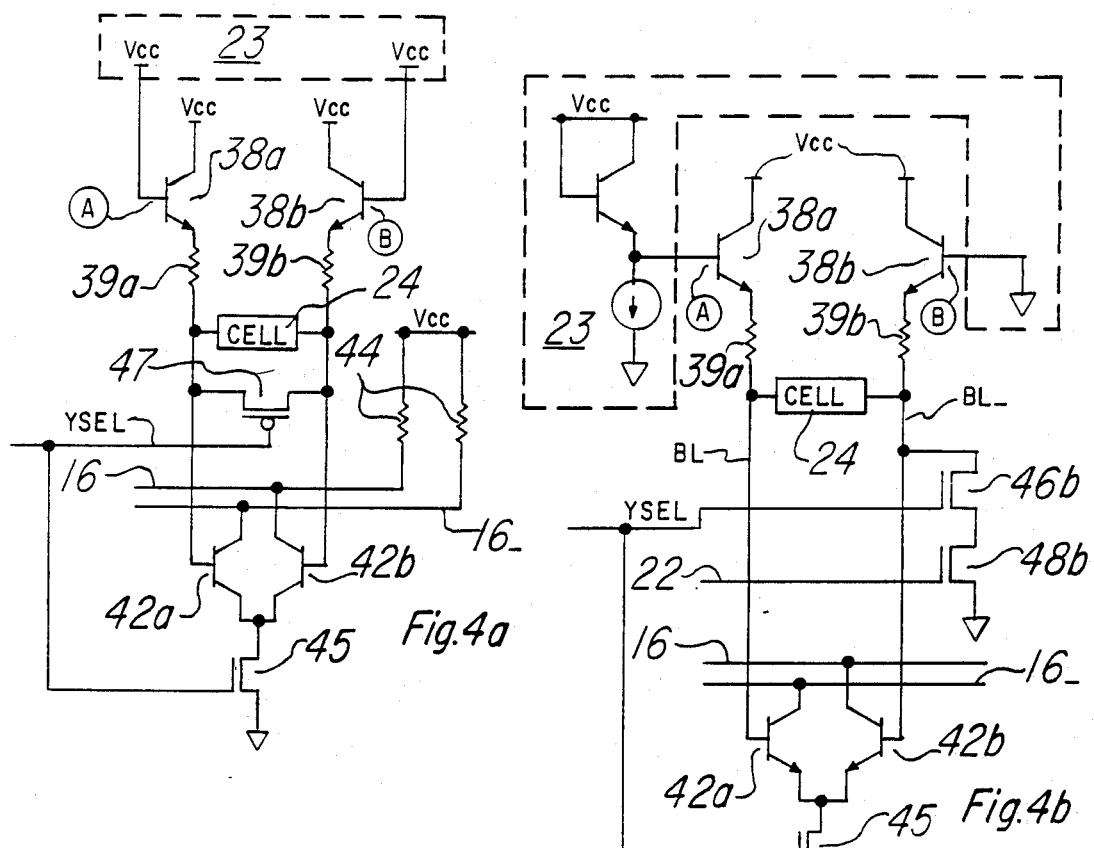
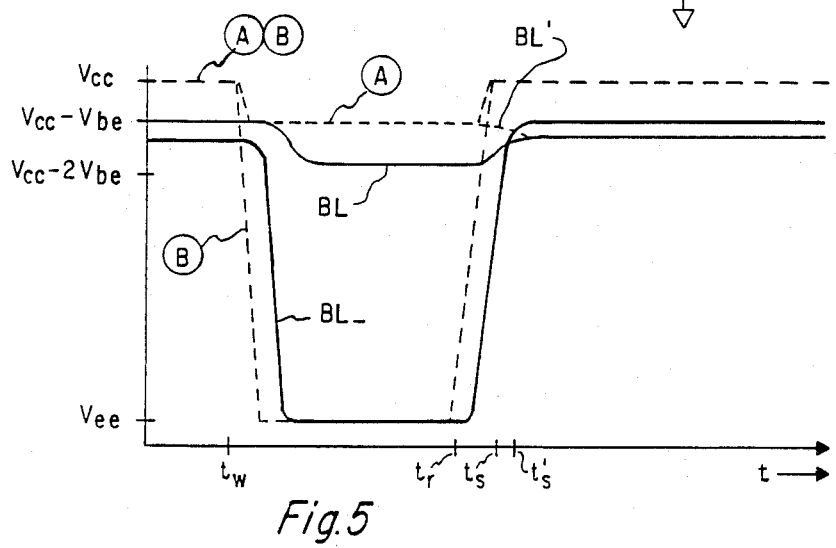
Fig.4a
Fig.4b
Fig.5

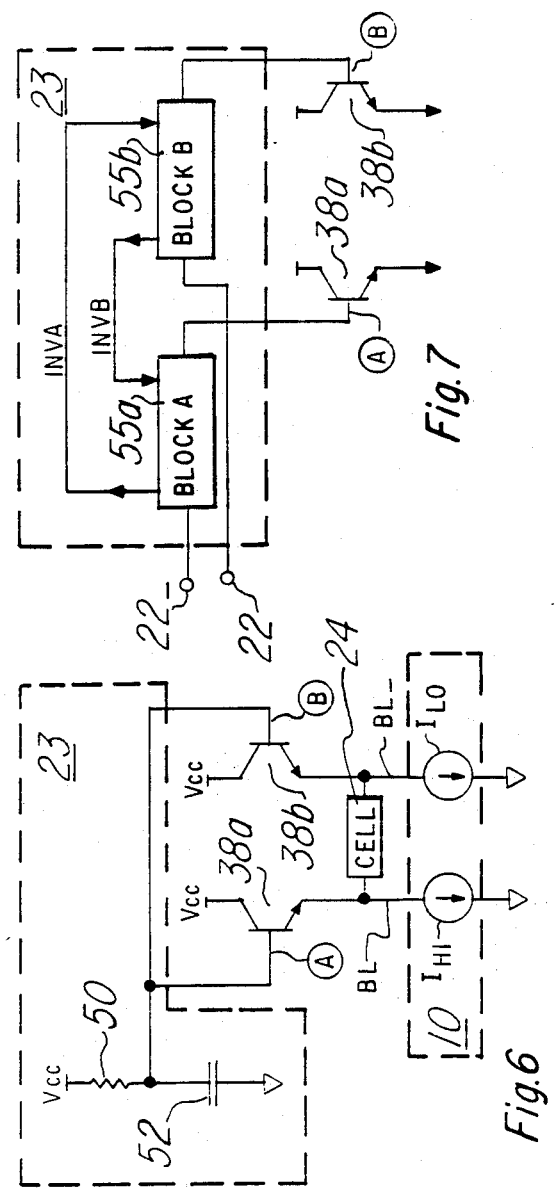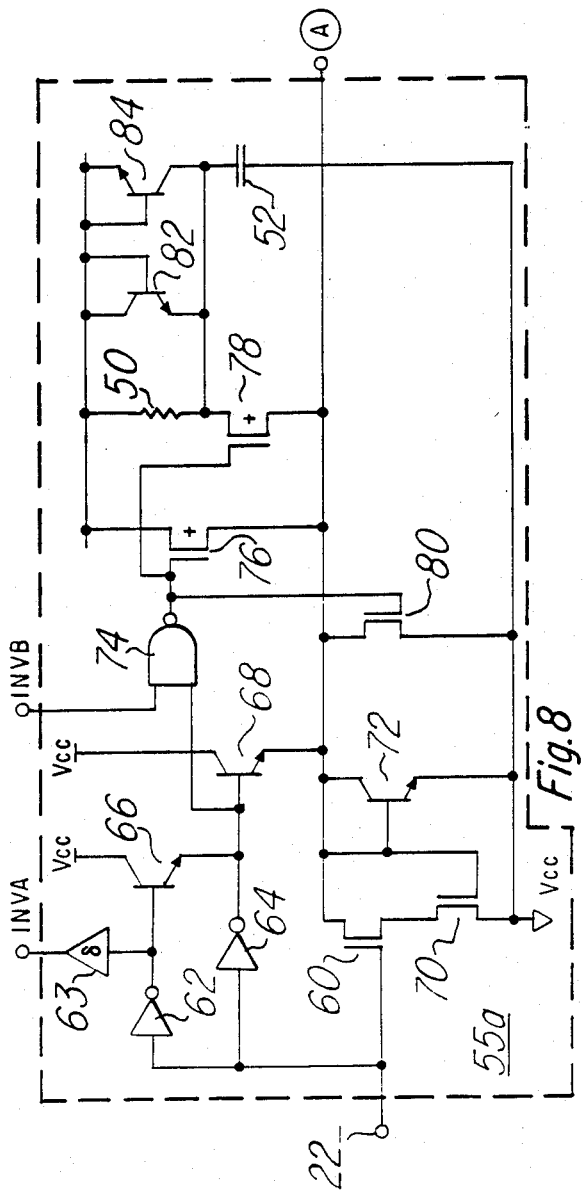

BITLINE PULL-UP CIRCUIT FOR A BICMOS READ/WRITE MEMORY

This application is related to application Ser. No. 156,520 both filed contemporaneously herewith.

This invention is in the field of electronic integrated circuits, and is specifically directed to circuits for use in read/write memory devices.

BACKGROUND OF THE INVENTION

Integrated circuit memory devices are often organized into rows and columns of memory cells, with the rows and columns separately selected based on the value of the portions of the memory address which represent row and column addresses. In such devices, the term "word lines" generally refers to a set of conductors of which one, when active, selects the addressed row of memory cells; the term "bit lines" generally refers to a set of conductors which communicate data between memory cells in the addressed row and a sense amplifier. The sense amplifier is a circuit which senses the data state of the data on an associated bit line, and which generally amplifies the sensed data state for communication to output stages of the circuit.

The sense amplifier of such memory circuits is generally called upon to sense a small differential voltage between a pair of bit lines to which the selected memory cell is connected. For purposes of speed, each of the bit lines in the the pair are generally precharged to a predetermined voltage and equalized by connecting the bit lines in the pair together for a brief period after the precharge operation. In conventional static random access memories ("SRAMs"), a pull-up device is connected between each of the bit lines and a power supply, such pull-up devices desirable to assist in pulling one of the bit lines in the bit line pair high while the other of the bit lines in the bit line pair is pulled low, the choice of which bit line goes high depending upon the sensed data state of the addressed memory cell. In a BiCMOS SRAM, a bipolar transistor is preferably used as the pull-up device as it will act as a diode clamp for the bit lines (holding the higher of the bit lines in the bit line pair at a voltage which is at least one diode drop below the positive power supply level) with a fast switching characteristic.

However, the diode characteristic of the bipolar pull-up device presents a problem in the event that noise is present on the positive ($V_{cc}$) power supply to which the pull-up transistors are connected. Positive noise on $V_{cc}$ will pull both bit lines to a higher voltage, while negative noise on $V_{cc}$ will not affect the voltage of the bit lines, due to the bipolar pull-up transistor acting as a diode. After a "bump" of positive noise on $V_{cc}$ pulls both bit lines to a higher level, a read cycle will cause one of the bit lines in the bit line pair to be pulled low, with the other of the bit lines to remain at the bumped voltage. A failure may occur in the next cycle after the bump if the positive bump is sufficiently large that the precharge and equalization operation, i.e., the pull-up of the bit lines by the pull-up transistors, is insufficient to fully equalize the bit lines at the end of the cycle. In the case of a fully static RAM, such a failure occurs when the bit line differential voltage due to the noise is sufficiently large that the memory cell has insufficient time to establish the bit line voltages in the correct polarity.

It is therefore an object of this invention to provide a bit line pull-up circuit which has a bipolar pull-up device, but which is tolerant of perturbations of the biasing power supply.

A write operation to a particular memory cell is generally accomplished by pulling one of the bit lines of the bit line pair to a low level ($V_{ee}$), while pulling the other of the bit lines to a high voltage level ($V_{cc}-V_{be}$). After the write cycle, the bit lines must again be pulled-up by the bipolar pull-up transistors to the same potential relative to one another in preparation for a read cycle thereafter. The large differential voltage of the bit lines after the write, however, requires either very large pull-up devices, or a long period of time for pulling up, either of which is not desirable.

It is therefore a further object of this invention to provide a bit line pull-up circuit which reduces the bit line differential voltage during a write cycle, speeding the recovery of the bit lines to an equalized voltage thereafter.

It is a further object of this invention to provide such a pull-up circuit incorporated in BiCMOS technology.

It is a further object of this invention to provide such a pull-up circuit in a configuration of one sense amplifier per column of memory cells.

It is a further object of this invention to provide such a pull-up circuit which both reduces the bit line differential voltage and also provides for improved tolerance of perturbations at the $V_{cc}$ power supply.

Other objects and advantages of the instant invention will become apparent to one of ordinary skill in the art having reference to the following specification, in conjunction with the accompanying drawings.

SUMMARY OF THE INVENTION

The invention may be incorporated into a BiCMOS SRAM read/write memory having a pair of complementary bit lines associated with each column of memory cells, each of said bit lines having a bipolar transistor for a pull-up device. A pull-up circuit is provided which acts as a low pass filter for noise perturbations on the power supply line, so that positive noise on the power supply will not pull the bit line voltages above the equalized value. Another pull-up circuit is provided which controls the base drive of the pull-up transistors during a write cycle so that the base drive of the pull-up transistor associated with the higher of the bit lines of the bit line pair is reduced, providing for a shorter crossover time in an ensuing read cycle.

BRIEF DESCRIPTION OF THE DRAWINGS

FIGS. 4a and 4b are electrical diagrams, in schematic form, illustrating biasing of the pull-up transistors for read and write cycles according to the invention.

FIG. 5 is a timing diagram showing the operation of the pull-up control circuitry in read and write cycles.

FIG. 6 is an electrical diagram, in schematic form, of a circuit for reducing the effects of power supply noise on the bit lines of FIG. 3, constructed according to the invention.

FIG. 7 is an electrical diagram, in block form, illustrating the construction of the pull-up control circuitry according to the invention.

FIG. 8 is an electrical diagram, in schematic form, of one of the blocks of the pull-up control circuitry constructed according to the invention.

DETAILED DESCRIPTION OF THE PREFERRED EMBODIMENT

Figure 1:
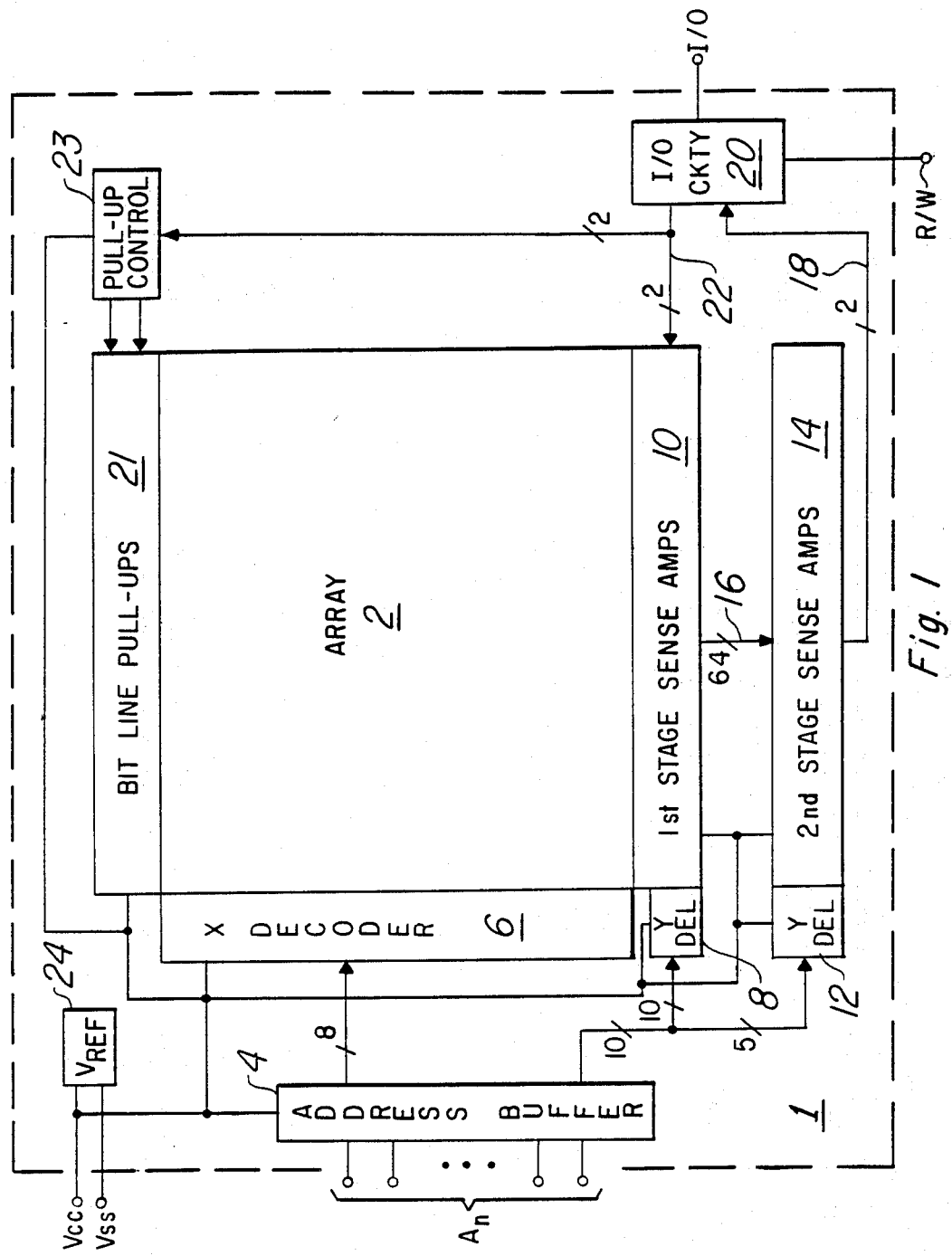
FIG. 1 is an electrical diagram, in block form, of a static random access memory (SRAM) incorporating the invention.

Referring now to FIG. 1, a block diagram of a static random access memory (SRAM) 1 is illustrated. This embodiment of SRAM 1 is a 256k bit memory, having a single input/output terminal I/O (i.e., SRAM 1 is organized as a 256k by 1 memory). The storage elements of SRAM 1 are contained in array 2, which in this embodiment is organized into 256 rows by 1024 columns. SRAM 1 receives address information on address inputs $A_n$. To individually address each bit within the 256k bit memory, address inputs $A_n$ number eighteen. Of course, if more than one bit were to be accessed at a time (for example, if 256k bit SRAM 1 were organized as a 32k by 8 memory, having eight inputs and eight outputs), fewer address inputs $A_n$ would be required.

Address inputs $A_n$ are received by address buffers 4 which, as is well known in the art, receive the value of the address externally presented at address inputs $A_n$. Eight of the eighteen address bits received by address buffers 4, such eight bits corresponding to a row address, are communicated to X decoder 6, for selecting one of the 256 rows in array 2. The remaining ten bits received by address buffers 4, corresponding to a column address, are communicated to first stage Y decoder 8, for selection of one of the 1024 columns in array 2 to be sensed by one of the 1024 first stage sense amplifiers 10. Each of the 1024 columns, and accordingly each of the 1024 first stage sense amplifiers, are associated with a complementary pair of bit lines, as will be described hereinbelow, and the selected one of the 1024 first stage sense amplifiers senses the differential voltage of the complementary bit lines. A bank of bit line pull-up transistors 21 are provided in SRAM 1, as will be explained in further detail below.

Five of the ten column address bits are also communicated to second stage Y decoder 12, for selection of one of the second stage sense amplifiers 14. The 1024 first stage sense amplifiers 10 are grouped into thirty-two groups of thirty-two, with each group having a complementary pair of local data lines 16 as an output. One of second stage sense amplifiers 14 is associated with each group of thirty-two first stage sense amplifiers, and receives at its input the associated pair of local data lines 16. A complementary pair of data-out lines 18 are driven by second stage sense amplifiers 14. In operation, the first stage sense amplifier 10 which corresponds to the column address is enabled by a signal from first stage Y decoder 8, while Y decoder 8 disables the others of first stage sense amplifiers 10 from sensing the data state of its associated pair of bit lines from array 2. The one of second stage sense amplifiers 14 which corresponds to the group of first stage sense amplifiers 10 having the selected column is also enabled, and the others of second stage sense amplifiers 14 are disabled. The selected one of second stage sense amplifiers 14 presents, on data-out lines 18, a differential voltage which is the amplification of the differential voltage on the local data lines 16 at its input, for communication to input/output circuitry 20. Input/output circuitry 20 communicates the state of data-out lines 18 to input/output terminal I/O.

Input/output circuitry 20 of SRAM 1 of FIG. 1 also receives input data from input/output terminal I/O; the determination of whether a read or a write cycle is desired depends upon the state of terminal R/W_, connected to input/output circuitry 20. During a write cycle, input/output circuitry 20 presents the logic state externally presented at input/output terminal I/O onto data-in bus 22, which presents the true and complement states of the input data to first stage sense amplifiers 10 for communication to the selected memory cell in array 2. Data-in bus 22 is also connected to pull-up control circuitry 23, to effect the write recovery operation described in further detail hereinbelow.

SRAM 1 also has reference voltage circuit 24, which receives the power supply voltages $V_{cc}$ and $V_{ee}$ (ground potential). Power supply voltages $V_{cc}$ and $V_{ee}$ are routed to transistors throughout SRAM 1 for biasing purposes, such routing not shown in FIG. 1 for purposes of clarity. The particular embodiment of SRAM 1 described herein is a BiCMOS SRAM, utilizing both bipolar transistors, as well as p-channel and n-channel MOS transistors. Certain circuits in this embodiment of SRAM 1 are realized in in emitter-coupled logic. Where emitter-coupled logic is used, reference voltage circuit 24 provides a band-gap reference voltage.

Figure 2:
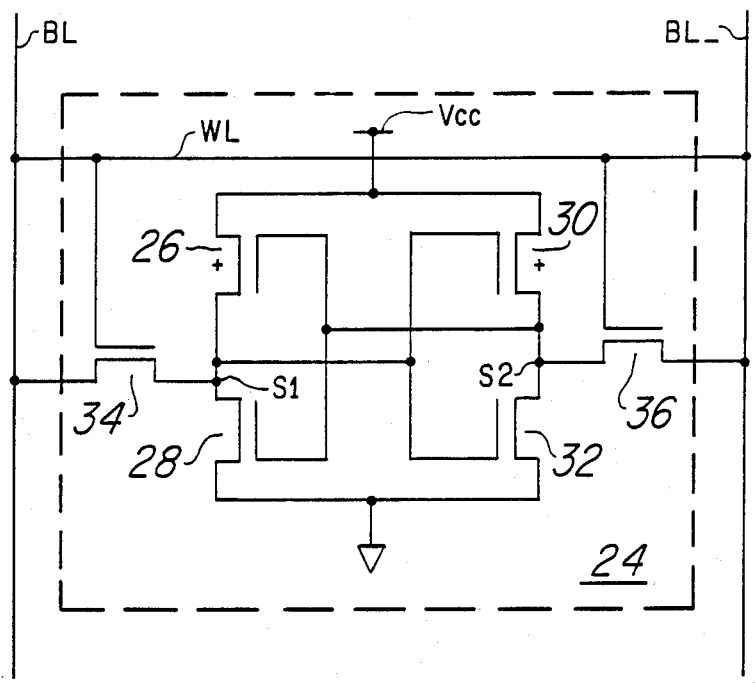
FIG. 2 is an electrical diagram, in schematic form, of a conventional CMOS memory cell as can be used in the SRAM of FIG. 1.

Referring now to FIG. 2, a conventional CMOS static memory cell 24 as incorporated into BiCMOS SRAM 1 is illustrated. Memory cell 24 is constructed according to the well-known cross-coupled inverter realization; since both p-channel and n-channel transistors are available, CMOS inverters are used in memory cell 24. A first CMOS inverter in memory cell 24 is made up of p-channel transistor 26 and n-channel transistor 28 having their source-to-drain paths connected in series between $V_{cc}$ and ground, and having their gates tied together. The second CMOS inverter in memory cell 24 is similarly constructed, with p-channel transistor 30 and n-channel transistor 32 having their source-to-drain paths connected in series between $V_{cc}$ and ground, and their gates also common. The cross-coupling is accomplished by the gates of transistors 26 and 28 being connected to the drains of transistors 30 and 32 (node S1 of FIG. 2), and by the gates of transistors 30 and 32 being connected to the drains of transistors 26 and 28 (node S2 of FIG. 2). N-channel pass transistor 34 has its source-to-drain path connected between node S1 and a first bit line BL, and has its gate connected to word line WL. N-channel pass transistor 36 similarly has its source-to-drain path connected between node S2 and a second bit line BL_, and has its gate also connected to word line WL.

In operation, the voltages of node S1 and S2 will necessarily be logical complements of one another, due to the cross-coupled nature of the CMOS inverters within memory cell 24. When word line WL is energized by X decoder 6 shown in FIG. 1, according to the row address received at address inputs $A_n$, pass transistors 34 and 36 will be turned on, coupling nodes S1 and S2 to bit lines BL and BL_, respectively. Accordingly, the state of bit lines BL and BL_ will be logical complements of one another when a memory cell 24 is connected thereto by the energizing of word line WL.

As described above for this embodiment, there are 256 word lines WL and 1024 pairs of bit lines BL and BL_ in array 2 of FIG. 1. For each value of the row address decoded by X decoder 6, one word line WL will be energized, connecting 1024 memory cells 24 to the 1024 pairs of bit lines BL and BL_. Since the other 255 word lines WL will be at a low logic level, only the one memory cell 24 associated with the selected word line WL in each column will be connected to the pair of bit lines BL and BL_ at a time.

Figure 3:
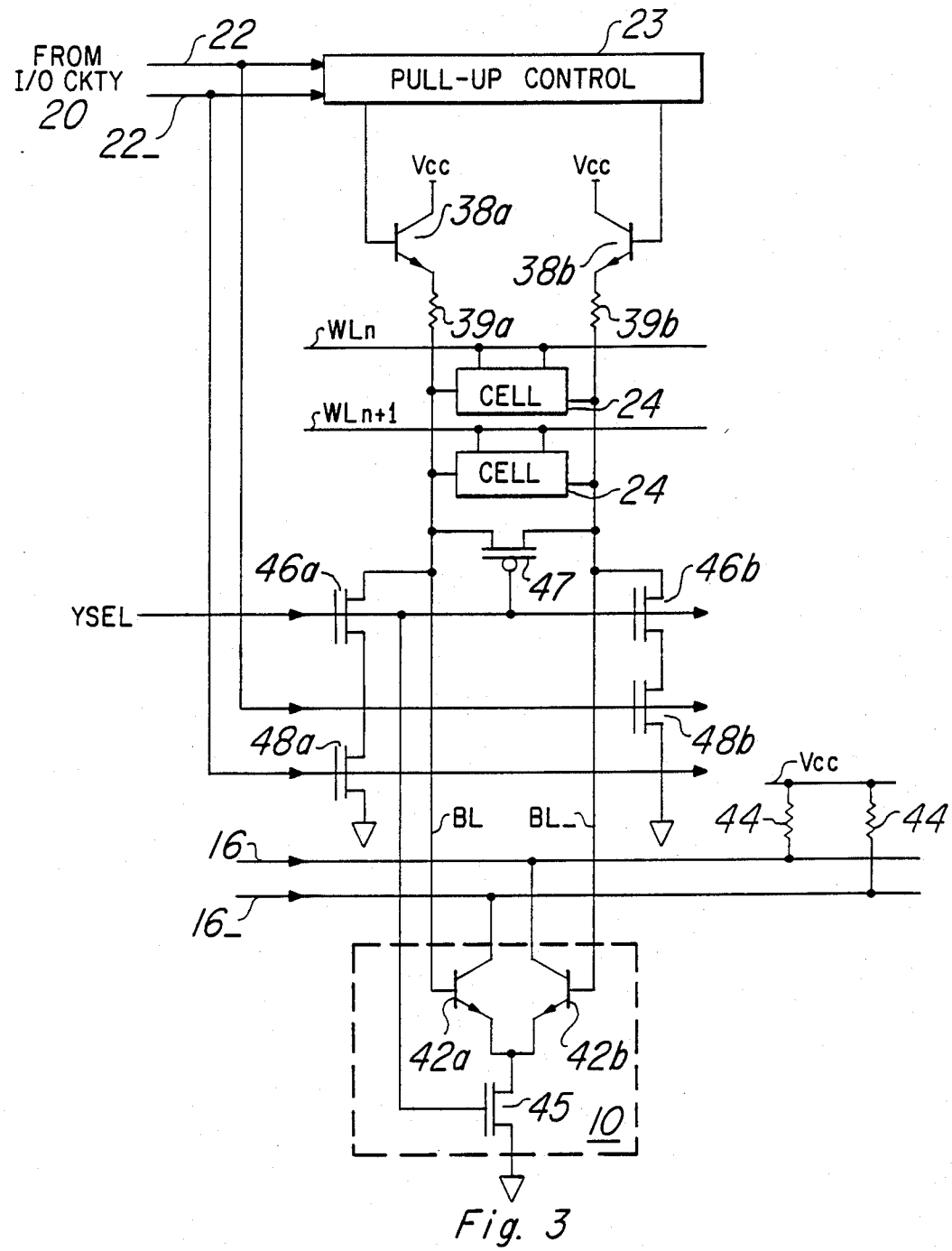
FIG. 3 is an electrical diagram, in schematic form, of a bit line pair in conjunction with the pull-up circuitry and sense amplifier.

Referring now to FIG. 3, a column of array 2 is illustrated. Only two memory cells 24 are illustrated, in conjunction with only two word lines $WL_n$ and $WL_{n+1}$, for purposes of clarity; as described above, each column has 256 memory cells 24 associated with 256 independent word lines WL. In the column shown in FIG. 3, cells 24 are shown connected to complementary bit lines BL and BL_. Bit lines BL and BL are connected to first stage sense amplifier 10 and, via n-p-n pull-up transistors 38a and 38b, respectively, to $V_{cc}$. Pull-up transistors 38 correspond to bit line pull-ups 21 shown in FIG. 1. The bases of pull-up transistors 38a and 38b are driven by pull-up control circuitry 23, which receives clocked input data from input/output circuitry 20 on data-in bus 22. Pull-up resistors 39a and 39b are connected between the emitter of transistors 38a and 38b and bit lines BL and BL_, respectively, to optimize the timing of the cross-over of bit lines BL and BL_ (indicating the sensed data) when pulled up by transistors 38a and 38b in a read operation.

First stage sense amplifier 10 consists of two emitter-coupled n-p-n transistors 42a and 42b, which have their bases connected to bit lines BL and BL_, respectively. The emitters of transistors 42a and 42b are connected to the drain n-channel transistor 45, which has its source coupled to ground and its gate connected to line YSEL. Transistor 45 is turned off when the column is not selected (i.e., line YSEL low), and is turned on to act as a current source when the column is selected (i.e., line YSEL high). Line YSEL also is connected to p-channel transistor 47, which serves to equalize bit lines BL and BL_ when it is on due to line YSEL low. Line YSEL, for a particular column, is low during cycles in which the column is not selected, equalizing bit lines BL and BL_. The collectors of transistors 42a and 42b are connected to local data lines 16_ and 16, respectively. As described above for this embodiment, thirty-two first stage sense amplifiers 10 share local data lines 16 and 16_. Local data lines 16 and $16^a$ _ are pulled up to $V_{cc}$ by resistors 44.

The write circuitry for a particular column consists of n-channel transistors 48a and 48b, which have their source-to-drain paths connected in a path between bit lines BL and BL_, respectively, and ground. The gates of n-channel transistors 48a and 48b are controlled by data-in lines 22_ and 22, respectively, one of which is taken to a high logic level at the time that a write operation is to occur, with the choice between data-in line 22 and 22_ depending upon the input data received at input/output terminal I/O. During read cycles, both data-in lines 22 and 22_ remain at a low logic level. N-channel transistors 46a and 46b are connected in series between transistors 48a and 48b, on the one hand, and bit lines BL and BL_, respectively, on the other hand. The gates of both of transistors 46a and 46b are controlled by line YSEL, so that the state of data-in lines 22 and 22_ affects only the selected one of the 1024 columns, and is isolated from the other columns.

FIG. 4a illustrates the equivalent circuit for a selected column of FIG. 3 in a read operation. FIG. 5 is a timing diagram showing, in the first cycle therein, the operation of the read cycle. During a read cycle, both of data-in lines 22 and 22_ of FIG. 3 will be at a low logic level. Responsive thereto, pull-up control circuitry 23 will present $V_{cc}$ to the bases of each of pull-up transistors 38a and 38b (nodes A and B on FIGS. 4a and 5) so that the voltage at the emitters of transistors 38a and 38b is the same, $V_{cc}-V_{be}$, where $V_{be}$ is the forward-biased diode drop across the base-emitter junction. The memory cell 24 selected by its word line WL will present a differential voltage on bit lines BL and BL_. This description will be for the case where bit line BL is high relative to bit line BL_. Accordingly, since bit line BL is higher than bit line BL_, the associated first stage sense amplifier transistor 42a will be turned on more than transistor 42b associated with bit line BL_. Since transistor 45 is on, and acts as a current source to keep the sum of the currents through transistors 42a and 42b constant, the higher drive at the base of transistor 42a will cause the bulk of the current through transistor 45 to flow through transistor 42a relative to transistor 42b. Due to pull-up transistors 38a and 38b, bit line BL will remain at approximately $V_{cc}-V_{be}$, while bit line BL_ will slightly drop in voltage, as shown in FIG. 5.

Since transistor 42a is conducting the bulk of the current passing through transistor 45, relative to transistor 42b, local data line 16_ will be pulled low, while local data line 16 will remain high due to the minimal drive through transistor 42b. The other first stage sense amplifiers 10 which share local data lines 16 and 16_ will have their respective transistors 45 turned off, so that the only transistor pulling down one of data lines 16 and 16_ will be the transistor 42a or 42b driven by the higher bit line BL or BL_ associated with the selected column.

FIG. 4b illustrates the equivalent circuit during a write operation for a column constructed according to the invention and shown in FIG. 3. One of the data-in lines 22 or 22_ will be pulled to a high level by input-/output circuitry 20, depending upon the input data received at input/output terminal I/O; in the example explained herein, data-in line 22 will be pulled to a high logic level for the write operation. This occurs at time $t_w$ shown on FIG. 5. Accordingly, transistor 48b of the column of FIG. 3 will be turned on by data-in line 22; once YSEL is asserted to a high level for the selected column, transistor 48b selects bit line BL_ to be pulled to a low level to effect the write, as illustrated in FIG. 4b.

According to the invention, pull-up control circuitry 23 presents differing levels of bias to the bases of pull-up transistors 38a and 38b, depending upon the data state to be written, beginning at time $t_w$ at the beginning of a write operation. At node B, i.e., the base of transistor 38b, pull-up control circuitry will apply $V_{ee}$, since transistor 38b is associated with the bit line BL_ which is to be pulled to a low level since data-in line 22 (rather than line 22_) is pulled high. According to the invention, beginning at time $t_w$, pull-up control circuitry 23 applies to node A (the base of transistor 38a) a voltage which is reduced from the bias applied during the read cycle. In this embodiment, the applied voltage is one diode drop ($V_{be}$) below $V_{cc}$, due to transistor 50a biasing the base of transistor 38a. Accordingly, on the "high" bit line (the bit line opposite the one being pulled low which, in this case, is bit line BL), pull-up transistor 38a will be biased to be conductive, but so that the voltage at the emitter of pull-up transistor 38a is at a reduced voltage relative to the read cycle. In this case, the voltage of the high bit line BL is at $V_{cc}-2V_{be}$ during the write operation, while the voltage of the low bit line BL__ is pulled down to $V_{ee}$.

The write is accomplished since transistors 46b and 48b pull bit line BL__ to $V_{ee}$, setting node S2 in memory cell 24 (referring to FIG. 2) to a low level, so that the cross-coupled inverters in memory cell 24 latch the desired data state. The low level on bit line BL__ will turn transistor 42b off in first stage sense amplifier 10. Even though transistor 42a will conduct all of the current allowed through transistor 45 (its base being at a voltage $V_{cc}-2V_{be}$ which is sufficient to keep transistor 42a on), the current allowed into the base of transistor 42a is limited so that bit line BL will remain at approximately the voltage $V_{cc}-2V_{be}$. The effect of the low level of bit line BL__ through transistors 46b and 48b will be to write the desired data into memory cell 24. Once node S2 of memory cell 24 and the parasitic capacitance of bit line BL__ are discharged, the voltage of bit line BL__ will drop approximately to the voltage $V_{ee}$, as shown in FIG. 5.

The full benefit of the reduced bias of transistor 38a on the high bit line BL during the write operation is evidenced during the time after a write operation, and prior to a read operation (i.e., the write recovery time). Referring to FIG. 5, the end of the write cycle begins, at time $t_r$, with the one of data-in lines 22 or 22__ (in this case line 22) going from a high to a low logic level. This turns off transistor 48a, decoupling bit line BL__ from $V_{ee}$ and allowing it to become responsive to pull-up transistor 38b, in this example. Also responsive to data-in line 22 returning to a low level, pull-up control circuitry 23 returns the bias on the bases of transistors 38a and 38b (nodes A and B, respectively), to $V_{cc}$. For the bit line which was low in the prior write cycle, e.g., bit line BL__, this biasing of pull-up transistor 38b pulls bit line BL__ back up toward $V_{cc}-V_{be}$, as in the read cycle described earlier. For the bit line which was high in the prior write cycle, e.g., bit line BL, the biasing of pull-up transistor 38a pulls bit line BL from $V_{cc}-2V_{be}$ back toward $V_{cc}-V_{be}$, as in the earlier-described read cycle.

In the event that the data state of the selected memory cell 24 is the same state as that written by the write cycle, the two bit lines BL and BL__ will go back to the differential voltage as shown in the first read cycle of FIG. 5. No speed improvement will be evidenced in this example, since the voltages of bit lines BL and BL__ will not cross-over prior to settling to the read state. However, in the case where the data read by the second read cycle is opposite that written by the write cycle, the voltages of the bit lines BL and BL__ will cross-over at a time earlier after $t_r$ due to the reduced bias on the base of the pull-up transistor 38 on the high side during the write cycle. This case is illustrated in the second read cycle in FIG. 5, and obviously presumes that a memory cell 24 in a different row from that written to in the write cycle is read in the second read cycle (in order to read different data).

Since the high side bit line, in this case bit line BL, is being raised by pull-up transistor 38a from a lower voltage $(V_{cc}-2V_{be})$ to a higher voltage $(V_{cc}-V_{be}-dV;$ dV being the delta voltage due to being the low side bit line in a read), the cross-over between the voltage of bit line BL and the voltage of bit line BL__ occurs at time $t_s$ shown in FIG. 5. At the time of the cross-over point ($t_s$), first stage sense amplifier 10 will flip to the proper data state as explained above, since the bit line of the high side (bit line BL__ in this case) will be driving its associated transistor 42 harder than will the bit line of the low side (BL), accomplishing the read. If the high side bit line from the prior write (e.g., bit line BL) were falling from a voltage $V_{cc}-V_{be}$ which is the same voltage as during the read cycle, the crossover point with bit line BL__ rising would not occur until a time after $t_s$. Waveform BL' shown on FIG. 5 illustrates the behavior of bit line BL in the event where the write bias on transistor 38a were the same during a write cycle as during a read; the later cross-over point is illustrated in FIG. 5 as time $t_s'$. The access time improvement due to the varying bias on the high side pull-up transistor is the time difference between time $t_s'$ and time $t_s$.

As described above relative to FIG. 4a, the bases of transistors 38a and 38b are biased to $V_{cc}$ during a read operation whether or not the particular column is selected. Pull-up transistors 38 each represent a diode between the bit line BL or BL__ and the voltage at the base of transistor 38. With the bases of transistors 38 connected to $V_{cc}$, a negative voltage bump on the $V_{cc}$ would not couple to bit lines BL and BL__, due to the base-emitter diode of n-p-n transistors 38 being reverse-biased if the base voltage drops below the bit line voltage. However, if the power supply $V_{cc}$ were to bump upward, bit lines BL and BL__ would follow the higher level of $V_{cc}$, since the voltage across the base-emitter junction would remain at $V_{be}$. During a read operation, the low bit line BL or BL__ will tend not to be pulled upward by the noise, as the selected memory cell 24 will hold it low, but the higher bit line will tend to follow the positive polarity noise on $V_{cc}$. Positive polarity noise on the $V_{cc}$ power supply would thus create a larger differential voltage between the bit lines than would be present in the absence of such noise. If the noise is sufficiently large, the bit line voltage differential may become large enough that equalization transistor 47 may not be able to equalize the bit lines, causing mis-sensing of the state of a selected memory cell 24 in a subsequent cycle.

Referring now to FIG. 6, another representation of an equivalent circuit for the column of FIG. 3 in a read operation, including another portion of pull-up control circuitry 23 associated with each of pull-up transistors 38a and 38b, is illustrated. The portion of pull-up control circuitry 23 illustrated in FIG. 6 performs a low-pass filter operation in order to filter relatively high frequency noise at the $V_{cc}$ power line from upsetting the equalization of the bit lines BL and BL__.

During a read operation as described above relative to FIG. 4a, one of the bit lines BL or BL__ will be high relative to the other, depending upon the data state of the selected memory cell 24. In the example shown in FIG. 6, bit line BL is high relative to bit line BL__. The operation of memory cell 24 and first stage sense amplifier 10, including selected transistor 45 operating as a current source and transistors 42a and 42b sharing the current passing through transistor 45, may be modeled as a first current source passing a current $I_{HI}$ coupled to higher bit line BL and a second current source passing a current $I_{LO}$ coupled to the lower bit line BL__; of course, with the opposite data state stored in selected memory cell 24, the equivalent current sources $I_{HI}$ and $I_{LO}$ would be coupled to the opposite bit lines BL and BL__. $I_{HI}$ corresponds to the base current of transistor 42a, in the example of bit line BL being high. $I_{LO}$ corresponds to the current drawn from bit line BL__ (in this example) by memory cell 24 presenting the low logic state thereto.

Incorporated into pull-up control circuitry 23, for purposes of biasing the bases of transistors 38a and 38b to $V_{cc}$, is a low-pass filter comprised of resistor 50 and capacitor 52. The low-pass filter allows the biasing of nodes A and B for the read operation, but filters out higher frequency noise on the $V_{cc}$ power supply so that positive polarity noise on $V_{cc}$ will not reach bit lines BL and BL__ through transistors 38a and 38b. The values of resistor 50 and capacitor 52 must be chosen so that the maximum rate of change of the voltage at nodes A and B after the filter is slower than the response of bit lines BL and BL__, via the equivalent current sources $I_{HI}$ and $I_{LO}$, to voltage excursions thereat. In the current embodiment, resistor 50 has a value of 10 kOhm, and capacitor 52 is an MOS capacitor in the range of 15 to 20 pF.

FIG. 7 is a block diagram of the construction of pull-up control circuitry 23. Pull-up control circuitry 23 contains two blocks 55a and 55b, each of blocks 55a and 55b containing substantially identical circuitry therewithin. Block 55a is for driving node A, the base of pull-up transistor 38a, while block 55b is for driving node B, the base of pull-up transistor 38b. Block 55a receives at an input data-in line 22, and a line INVB generated by block 55b, as will be described later. Block 55b similarly receives data-in line 22__, and a line INVA generated by block 55a as will be described later.

Referring now to FIG. 8, a detailed schematic of block 55a will be described. Block 55b is similarly constructed, as noted above. Data-in line 22 is received by block 55a at the gate of n-channel transistor 60, and by the inputs of inverters 62 and 64. Inverters 62 and 64 are preferably CMOS inverters, constructed in the well-known push-pull realization. The output of inverter 62 is connected to the base of an n-p-n transistor 66, and the output of inverter 64 is connected to the base of an n-p-n transistor 68. Transistors 66 and 68 have their collectors biased by $V_{cc}$, and are connected together in the well-known Darlington configuration, with the emitter of transistor 66 driving the base of transistor 68. The emitter of transistor 68 is connected to the output of block 55a, at node A. The combination of inverters 62 and 64, and Darlington transistors 66 and 68, serve as a high speed pull-up circuit, as described in U.S. patent application Ser. No. 156,520, filed herewith. This pull-up circuit presents, at node A, the logical complement of the state of data-in line 22.

On the pull-down side, the source-to-drain path of transistor 60 is connected in series with the source-to-drain path of n-channel transistor 70, between node A and $V_{ee}$. The gate of transistor 70 is connected to node A. The junction between transistors 60 and 70 is connected to an n-p-n transistor 72 which has its collector connected to node A, and its emitter connected to $V_{ee}$. The pull-down circuit of transistors 60, 70 and 72 serve to quickly pull down node A in the event that the logic state of data-in line 22 switches from a low logic level to a high logic level.

The output of inverter 64 is also connected to a first input of NAND gate 74; the other input of NAND gate 74 receives line INVB from block 55b of pull-up control circuitry 23. The output of inverter 62, via delay stage 63, presents a logic state on line INVA to block 55b within pull-up control circuitry. It should be noted that line INVA is connected to an input of a NAND gate within block 55b similarly positioned as NAND gate 74 in block 55a, and that line INVB is driven by an inverter in block 55b similarly positioned as inverter 62 in block 55a. Such interconnection serves to cross-couple blocks 55a and 55b for control of the various read and write states as will be described hereinbelow.

NAND gate 74 drives the gate of p-channel transistor 76, the gate of p-channel transistor 78, and the gate of small n-channel transistor 80. Transistor 76 has its source-to-drain path connected between $V_{cc}$ and node A, and transistor 78 has its source-to-drain path connected in series with filter resistor 50 between $V_{cc}$ and node A. Transistor 80 has its source-to-drain path connected between node A and $V_{ee}$. Further provided in conjunction with the low-pass filter of resistor 50 and capacitor 52 are n-p-n transistors 82 and 84, connected in diode configuration. Transistor 82 has its collector and base connected to $V_{cc}$ and its emitter connected to the source of transistor 80, while transistor 84 has its collector connected to the source of transistor 80 and its base and emitter connected to $V_{cc}$. Accordingly, when transistor 78 is on during the read operation (as will be described hereinbelow), transistors 82 and 84 will operate as opposed diodes between $V_{cc}$ and node A, preventing the buildup of a significant differential voltage therebetween.

In operation, block 55a will serve to present node A with the voltages described hereinabove relative to FIGS. 4a and 4b depending upon the type of cycle being performed by SRAM 1, with the low-pass filtering provided during a read cycle as illustrated in FIG. 6. For a read cycle, as described above, data-in lines 22 and 22__ will both be at a low logic level. Relative to block 55a, line 22__ being low turns off transistor 60, in turn forcing transistor 72 off. Inverters 62 and 64 both present a high logic level at their output, turning on both of transistors 66 and 68. As described in said application Ser. No. 156,520, the operation of the Darlington configured transistors 66 and 68 will be such that node A will be quickly begin charging node A to a full $V_{cc}$ level, the full level due to the bootstrapping from the parasitic junction capacitance of the base-emitter junction of transistor 68. The output of inverter 64 will also present a high level to NAND gate 74, and the output of inverter 62, after delay by delay stage 63, will present a high level on line INVA.

Since data-in line 22 is also at a low state, though, and since block 55b is similarly constructed as block 55a, line INVB from block 55b will also go to a high level at the second input to NAND gate 74. The output of NAND gate 76 will thus go to a low level, turning on p-channel transistors 76 and 78. P-channel transistor 76 thus will assist in the pulling up of node A to $V_{cc}$, and will keep node A at this level until a change in the output of NAND gate 74 occurs. Transistor 78 serves to connect the low pass filter of resistor 50 and capacitor 52 to node A, as described in FIG. 7, for purposes of filtering out high frequency noise on the $V_{cc}$ power supply line. Diodes 82 and 84, as described above, limit the differential voltage possible between $V_{cc}$ and node A during such time as transistor 78 is on. Transistor 80 is of course held off during the read cycle by the output of NAND gate 74. Since the connection of resistor 50 and capacitor 52 to node A is gated by transistor 78 within block 55a, the filter circuit of block 55a may be shared with block 55b or with additional blocks 55a and 55b, if multiple pull-up control blocks are provided for other bit line pairs in SRAM 1. This sharing may be accomplished be connecting the node at the source of transistor 78 to the sources of similarly positioned transistors in the other blocks.

For a write cycle where bit line BL is to be taken to a low level, i.e., where data line 22_ goes to a high level as shown in FIG. 3, node A is to be biased to $V_{ee}$. The circuit of block 55a shown in FIG. 8 accomplishes this by transistor 60 turning on with data-in line 22_ going to a high level. Transistors 70 and 72 are turned on by transistor 60 turning on, in the event that node A was originally at a high level, so that node A can be quickly discharged through bipolar transistor 72. In addition, the outputs of inverters 62 and 64 go to a low level, turning off transistors 66 and 68 and, via NAND gate 74, ensuring that transistors 76 and 78 are off. Small transistor 80 turns on, as well. Accordingly, node A is pulled to $V_{ee}$ by block 55a in the event of data-in line 22_ going to a high level, signifying that bit line BL associated with transistor 38a (driven by node A) is to be taken low for a write operation. The output of inverter 62 is communicated to the input of a NAND gate in block 55b similar to NAND gate 74, to accomplish the bias of node B in a manner as will be explained below for block 55a.

For a write cycle where bit line BL_ is to be taken low, i.e., where data line 22 goes to a high level, node A is to be biased to $V_{cc}-V_{be}$ according to the invention, as described hereinabove relative to FIG. 4b. In this event, data-in line 22_ will be low, turning on transistors 66 and 68, and turning off transistors 60, 70 and 72, as in the case of the read cycle described hereinabove. However, since data-in line 22 is at a high level, block 55b will be presenting a low logic level on line INVB to the second input of NAND gate 74, since the inverter in block 55b similarly positioned as inverter 62 in block 55a will have a low output due to data-in line 22 being at a high logic level. Accordingly, in block 55a the output of NAND gate 74 will be at a high level (one of its inputs being low), which turns off transistors 76 and 78 but which turns on transistor 80, coupling node A to $V_{ee}$ therethrough.

As described above, however, transistor 80 is a relatively small transistor, and will tend to be a resistive load to the Darlington pair of transistors 66 and 68. This resistive load will cause the circuit of transistor 68 and transistor 80, with node A at the junction therebetween, to act as an emitter follower. After the decay of any bootstrapping at the base of transistor 68, the base of transistor 68 will be at $V_{cc}$ potential, driven by CMOS inverter 64. Accordingly, the emitter of transistor 68, at node A, will be at $V_{cc}-V_{be}$, due to transistor 80 acting as a pull-down load thereto. Block 55a thus operates to bias node A, i.e., the base of transistor 38a in FIG. 4b, to a voltage of $V_{cc}-V_{be}$, which is a voltage lower than that to which node A is biased during a read cycle. Accordingly, the crossover point is reached at an earlier time when a read cycle is initiated subsequent to the write operation, as shown in FIG. 6.

The delay of delay stage 63 is utilized in order to allow the cross-over point of the bit lines BL and BL_ to occur early during the read cycle following a write cycle. The delay presented on line INVB to block 55a (and, conversely, on line INVA to block 55b) allows the p-channel transistors 76 and 78 to remain off following a write cycle for the data state where its associated pull-up transistor 38 is driven to $V_{cc}-V_{be}$. For example, if block 55a (similarly constructed as block 55a) biases node A to $V_{cc}-V_{be}$ during a write cycle and if line 22 to block 55b returns to a low state to signify a read, it is preferable to keep transistors 76 and 78 off, preventing node A from being pulled immediately from $V_{cc}-V_{be}$ to a full $V_{cc}$ level for a period of time while bit line BL_ is being charged in the read operation. As shown in FIG. 5, if node A were to go to $V_{cc}$ prior to node B, bit line BL could reach its final level at an earlier time after $t_r$. The early cross-over point according to the invention, however, is due to the voltage of bit line BL (in the illustrated case) being at a lower voltage during a write cycle than during a read, which allows the cross-over point to occur while both bit lines BL and BL_ are charging up. The cross-over point at time $t_s$ would be delayed if it occurred after bit line BL is fully charged by memory cell 24 to its final level. The longer the delay, the lower the voltage on bit line BL at the point of crossover, and therefore the earlier that bit line BL_ reaches the voltage of bit line BL. Of course, the amount of delay of delay stage 63 cannot be so long as to cause a false crossover in the case of a read of the opposite data state from that shown in FIG. 5, where the delay is so long that bit line BL were held at $V_{cc}-2V_{be}$ after bit line BL_ had charged to the "zero" sensed level. It should be noted that the delay of delay stage 63 could alternatively be accomplished in various other ways than that shown in FIG. 8, such as by deriving a signal from node A.

As illustrated herein, block 55a may be operable to control the bias of pull-up transistors 38a for all of the 1024 columns in SRAM 1, and block 55b may be operable to control the bias of pull-up transistors 38b for all of the 1024 columns in SRAM 1. Alternatively, the 1024 columns may be divided into groups of columns, with a pair of blocks 55a and 55b provided for each group of columns. Where multiple blocks 55a and 55b are provided, each serving a only a group of columns in SRAM 1, decoding and selection circuitry may be provided within each of the blocks 55a and 55b to selectively disable all those blocks 55a and 55b except the pair associated with the group of columns containing the selected column. Such disabling would preferably place the disabled blocks 55a and 55b in a state so as to bias the bases of pull-up transistors 38 to $V_{cc}$ during a write operation to a column in another group.

As described above, the subject invention provides for pull-up control circuitry which improves the reliability of data storage in a memory device, as well as improving its performance. The increased reliability is especially provided for a memory device in an environment where the $V_{cc}$ power supply is noisy, such improved reliability due to the filter contained in the pull-up control circuitry 23. The improved performance is provided for improved read access time in cycles following write operations, due to the pull-up control circuitry biasing of the pull-up transistors in write cycles to a lower voltage than during a read cycle.

It should further be noted that the above-described embodiment is directed to an architecture where each column has its own first stage sense amplifier. The benefits of the invention in reducing the effects of power supply noise on the bit line voltage, and in biasing the bit lines during the write operation to provide for improved write recovery, will be applicable to those architectures where multiple columns share a single sense amplifier.

Although the invention has been described in detail herein with reference to its preferred embodiment, it is to be understood that this description is by way of example only, and is not to be construed in a limiting sense. It is to be further understood that numerous changes in the details of the embodiments of the invention, and additional embodiments of the invention, will be apparent to, and may be made by, persons of ordinary skill in the art having reference to this description. It is contemplated that such changes and additional embodiments are within the spirit and true scope of the invention as claimed below.

I claim:

1. A read/write memory device of the type having an array of memory cells arranged in rows and columns, a row decoder for receiving a row address signal and for selecting a row in said said array of memory cells responsive thereto, and a column decoder for receiving a column address signal and for selecting a column in said array of memory cells responsive thereto, said read/write memory device operable to present the data of a memory cell in the selected column which is in the selected row during a read operation, and to write input data to a memory cell in the selected column which is in the selected row during a write operation, wherein each column of memory cells in said array share true and complement bit lines, said memory device further comprising:

- a sense amplifier in communication with the bit lines of the column of said array selected by said column decoder for sensing the data stored in the memory cell in said selected column which is in said selected row;
- write circuitry for biasing the true bit line in the selected column to a predetermined voltage responsive to the input data at a first logic state in a write operation, and for biasing the complement bit line in the selected column to said predetermined voltage responsive to the input data at a second logic state in a write operation;
- a first pull-up transistor for each true bit line in each column, each said first pull-up transistor having its emitter connected to its associated true bit line and its collector connected to a power supply node, and having a base;
- a second pull-up transistor for each complement bit line in each column, each said second pull-up transistor having its emitter connected to its associated complement bit line and its collector connected to said power supply node, and having a base;
- pull-up control circuitry connected to the bases of said first and second pull-up transistors, so that both said first and second pull-up transistors are biased to an on-state in a read operation, and so that in a write operation one of said first or second pull-up transistors in the selected column is biased on to a lower voltage than the on-state in a read operation and the other is biased off, depending upon the logic state of said input data.

2. The read/write memory device of claim 1, wherein a sense amplifier is provided for each column in said array.

3. The read/write memory device of claim 1, wherein said write circuitry biases said true bit line in the selected column to a low voltage responsive to the input data at a first logic state in a write operation, and biases the complement bit line in the selected column to a low voltage responsive to the input data at a second logic state in a write operation.

4. The read/write memory device of claim 3, wherein said pull-up control circuitry biases said first pull-up transistor in said selected column off, and biases said second pull-up transistor in said selected column to a lower voltage than the on-state in a read operation responsive to the input data at said first logic state, and wherein said pull-up control circuitry biases said second pull-up transistor in said selected column off, and biases said first pull-up transistor in said selected column to a lower voltage than the on-state in a read operation responsive to the input data at said second logic state.

5. The read/write memory device of claim 1, wherein said pull-up control circuitry also, in a write operation, biases one of said first and second pull-up transistors in an unselected column on to a lower voltage than the on-state in a read operation and biases the other off, depending upon the logic state of said input data.

6. The read/write memory device of claim 1, wherein said pull-up control circuitry also filters noise on said power supply node from the bases of said first and second pull-up transistors in a read operation.

7. The read/write memory device of claim 1, wherein said pull-up control circuitry comprises:

- a first block for biasing the base of said first pull-up transistors, having a data input for receiving a data-in signal, a feedback input a feedback output, and a bias output connected to said base of said first pull-up transistors; and
- a second block for biasing the base of said second pull-up transistors, having a data input for receiving the complement of the data-in signal received by said first block, having a feedback input connected to the feedback output of said first block, having a feedback output connected to the feedback input of said second block , and having a bias output connected to the base o said second pull-up transistors.

8. The read/write memory device of claim 7, wherein said pull-up control circuitry further comprises a low-pass filter connected to said power supply node and to the bias outputs of said first and second blocks.

9. The read/write memory device of claim 7, wherein each of said first and second blocks comprise:

- a pull-down circuit, connected between a reference supply node and said bias output and controlled by said data input, for pulling down the bias output to said reference supply node responsive to said data input at a first logic state;
- a feedback circuit, connected to said data input, for presenting a signal at said feedback output corresponding to the data state of said data input;
- a first pull-up circuit, connected between said power supply node and said bias node, for pulling up the bias output to said power supply node responsive to said data input at a second logic state, and responsive to said feedback input indicating that said data input of the other block is at said second logic state;
- a second pull-up circuit, connected between said power supply node and said bias node, for biasing the bias output to a lower level than said first pull-up circuit responsive to said data input at said second logic state and said feedback input indicating that said data input of the other block is at said first logic state.

10. The read/write memory device of claim 9, wherein said second pull-up circuit comprises:

- a bipolar drive transistor having its collector connected to said power supply node, its emitter connected to said bias node, and its base responsively coupled to said data input to turn said bipolar drive transistor on responsive to said data input at said second logic state;

a field effect load transistor having its source-to-drain path connected between said bias node and said reference supply node, and having a gate;

logic having a first input connected to said feedback input and a second input responsively coupled to said data input, and having an output connected to the gate of said field effect load transistor so that said field effect load transistor is turned on responsive to said data input at said second logic state and said feedback input indicating that the data input of the other block is at said first logic state.

11. The read/write memory of claim 10, wherein said logic turns off said field effect transistor responsive to said data input at said second logic state and said feedback input indicating that the data input of the other block is at said second logic state.

12. In a read/write memory of the type having an array of memory cells arranged in rows and columns, a row decoder for receiving a row address signal and for selecting a row in said said array of memory cells responsive thereto, a column decoder for receiving a column address signal and for selecting a column in said array of memory cells responsive thereto, sense and output circuitry for presenting the data of a memory cell in the selected column which is in the selected row during a read operation, and write circuitry for writing input data to a memory cell in the selected column which is in the selected row during a write operation, wherein each column of memory cells in said array share true and complement bit lines, the improvement comprising:

a first pull-up transistor for each true bit line in each column, each said first pull-up transistor having its emitter connected to its associated true bit line and its collector connected to a power supply node, and having a base;

a second pull-up transistor for each complement bit line in each column, each said second pull-up transistor having its emitter connected to its associated complement bit line and its collector connected to said power supply node, and having a base; and pull-up control circuitry connected to the bases of said first and second pull-up transistors, comprising:

bias circuitry connected to said bases of said first and second pull-up transistors so that both said first and second pull-up transistors are biased to an on-state in a read operation; and a low-pass filter connected between said power supply node and said bases of said first and second pull-up transistors.

13. The improved read/write memory device of claim 12, wherein said bias circuitry also is responsive to input data to the memory device, so that in a write operation one of said first or second pull-up transistors in the selected column is biased on to a lower voltage than the on-state in a read operation and the other is biased off, depending upon the logic state of said input data.

14. The improved read/write memory device of claim 13, wherein said bias circuitry comprises:

a first block for biasing the base of said first pull-up transistors, having a data input for receiving a data-in signal, a feedback input a feedback output, and a bias output connected to said base of said first pull-up transistors; and a second block for biasing the base of said second pull-up transistors, having a data input for receiving the complement of the data-in signal received by said first block, having a feedback input connected to the feedback output of said first block, having a feedback output connected to the feedback input of said second block, and having a bias output connected to the base of said second pull-up transistors.

15. The improved read/write memory device of claim 14, wherein each of said first and second blocks comprise:

a pull-down circuit, connected between a reference supply node and said bias output and controlled by said data input, for pulling down the bias output to said reference supply node responsive to said data input at a first logic state;

a feedback circuit, connected to said data input, for presenting a signal at said feedback output corresponding to the data state of said data input;

a first pull-up circuit, connected between said power supply node and said bias node, for pulling up the bias output to said power supply node responsive to said data input at a second logic state, and responsive to said feedback input indicating that said data input of the other block is at said second logic state;

a second pull-up circuit, connected between said power supply node and said bias node, for biasing the bias output to a lower level than said first pull-up circuit responsive to said data input at said second logic state and said feedback input indicating that said data input of the other block is at said first logic state.

16. The improved read/write memory device of claim 15, wherein said low-pass filter is contained within said first pull-up circuit of one of said blocks.

17. The improved read/write memory device of claim 15, wherein said second pull-up circuit comprises:

a bipolar drive transistor having its collector connected to said power supply node, its emitter connected to said bias node, and its base responsively coupled to said data input to turn said bipolar drive transistor on responsive to said data input at said second logic state;

a field effect load transistor having its source-to-drain path connected between said bias node and said reference supply node, and having a gate;

logic having a first input connected to said feedback input and a second input responsively coupled to said data input, and having an output connected to the gate of said field effect load transistor so that said field effect load transistor is turned on responsive to said data input at said second logic state and said feedback input indicating that the data input of the other block is at said first logic state.

18. The improved read/write memory of claim 17, wherein said logic turns off said field effect transistor responsive to said data input at said second logic state and said feedback input indicating that the data input of the other block is at said second logic state.

19. The improved read/write memory of claim 20, wherein said first and second blocks each further comprise:

a filter connect transistor having a source-to-drain path connected between a filter node and said bias output, and having a gate connected to the output of said logic so that said filter connect transistor disconnects said filter node to said bias output responsive to either said data input at said first logic state or said feedback input indicating that the data input of the other block is at said first logic state;
wherein said first block further comprises said low-pass filter, comprising:
a resistor connected between a filter node and said power supply node; and
a capacitor connected between said filter node and said reference supply node;
and wherein said filter node of said first block is connected to the filter node of said second block.

20. A read/write memory device of the type having an array of memory cells arranged in rows and columns, a row decoder for receiving a row address signal and for selecting a row in said said array of memory cells responsive thereto, and a column decoder for receiving a column address signal and for selecting a column in said array of memory cells responsive thereto, said read/write memory device operable to present the data of a memory cell in the selected column which is in the selected row during a read operation, and to write input data to a memory cell in the selected column which is in the selected row during a write operation, wherein each column of memory cells in said array share true and complement bit lines, said memory device further comprising:
a sense amplifier in communication with the bit lines of the column of said array selected by said column decoder for sensing the data stored in the memory cell in said selected column which is in said selected row;
write circuitry for biasing the true bit line in the selected column to a predetermined voltage responsive to the input data at a first logic state in a write operation, and for biasing the complement bit line in the selected column to said predetermined voltage responsive to the input data at a second logic state in a write operation;
a first pull-up transistor for each true bit line in each column, each said first pull-up transistor having its emitter connected to its associated true bit line and its collector connected to a power supply node, and having a base;
a second pull-up transistor for each complement bit line in each column, each said second pull-up transistor having its emitter connected to its associated complement bit line and its collector connected to said power supply node, and having a base;
pull-up control circuitry connected to the bases of said first and second pull-up transistors, so that both said first and second pull-up transistors are biased to an on-state in a read operation, and so that in a write operation one of said first or second pull-up transistors in the selected column is biased on to a lower voltage than the on-state in a read operation and the other is biased off, depending upon the logic state of said input data, said pull-up control circuitry comprising:

a first block for biasing the base of said first pull-up transistors, having a data input for receiving a first data-in signal, a feedback input, a delayed feedback output for presenting a delayed signal corresponding to the logic state of said data-in signal, and a bias output connected to said base of said first pull-up transistors; and
a second block for biasing the base of said second pull-up transistors, having a data input for receiving a second data-in signal, having a feedback input connected to the feedback output of said first block, having a feedback output connected to the feedback input of said first block, for presenting a delayed signal corresponding to the logic state of said second data-in signal, and having a bias output connected to the base of said second pull-up transistors.

21. The memory of claim 20, wherein, for a write operation, the first and second data-in signals presented to said first and second blocks are the logical complement of one another.

22. The memory of claim 21, wherein, for a read operation, the first and second data-in signals presented to said first and second blocks are at the same data state.

23. The memory of claim 20, wherein each of said first and second blocks comprise:
a pull-down circuit, connected between a reference supply node and said bias output and controlled by said data input, for pulling down the bias output to said reference supply node responsive to said data input at a first logic state;
a feedback circuit, connected to said data input, for presenting a signal at said feedback output corresponding to the data state of said data input, delayed by a predetermined time;
a first pull-up circuit, connected between said power supply node and said bias node, for pulling up the bias output to said power supply node responsive to said data input at a second logic state, and responsive to said feedback input indicating that data input of the other block is at said second logic state;
a second pull-up circuit, connected between said power supply node and said bias node, for biasing the bias output to a lower level than said first pull-up circuit responsive to said data input at said second logic state and said feedback input indicating that said data input of the other block is at said first logic state.

24. The memory of claim 23, wherein the predetermined delay time of said feedback output in each block is such that the first pull-up circuit is not turned on responsive to its feedback input indicating that said data input of the other block is at said second logic state until after such time as the bias output of the other block has been pulled up by its second pull-up circuit most of the way to said lower level.

* * * * *